United States Patent [19]
Brehmer

[11] Patent Number: 5,805,021
[45] Date of Patent: Sep. 8, 1998

[54] HIGH SWING LOW POWER GENERAL PURPOSE OPERATIONAL AMPLIFIER

[75] Inventor: Geoffrey E. Brehmer, Lexington, Tex.

[73] Assignee: Advanced Micro Devices, Sunnyvale, Calif.

[21] Appl. No.: 600,843

[22] Filed: Feb. 13, 1996

[51] Int. Cl.⁶ .................... H03F 3/45; H03F 3/16
[52] U.S. Cl. .................. 330/253; 330/255; 330/292
[58] Field of Search .................... 330/253, 255, 330/277, 292

[56] References Cited

U.S. PATENT DOCUMENTS

| | | | |
|---|---|---|---|
| 5,406,220 | 4/1995 | Jones et al. | 330/292 X |
| 5,457,426 | 10/1995 | Brehmer | 330/253 |
| 5,477,190 | 12/1995 | Brehmer et al. | 330/253 |
| 5,515,003 | 5/1996 | Kimura | 330/255 X |

FOREIGN PATENT DOCUMENTS 2 251 745  7/1992  United Kingdom .

OTHER PUBLICATIONS

R.K. Hester, et al., "Fully Differential ADC with Rail-to-Rail Common–Mode Range and Nonlinear Capacitor Compensation," *IEEE Journal of Solid-State Circuits*, vol. 25, No. 1, pp. 173–182 (Feb. 1990).

M. Milkovic, "Current Gain High-Frequency CMOS Operational Amplifiers," *IEEE Journal of Solid-State Circuits*, vol. SC–20, No. 4, pp. 845–851 (Aug. 1985).

*Primary Examiner*—Steven Mottola
*Attorney, Agent, or Firm*—Stanford & Bennett LLP

[57] ABSTRACT

An operational amplifier circuit is provided which includes: 1) a first folded-cascode gain stage having a differential pair of natural $V_T$ devices which are P-channel transistors; 2) a second gain stage connected to an output of the first folded-cascode gain stage; 3) a slave source follower stage connected to an output of the second gain stage; 4) a second folded-cascode stage connected to an output of the slave source follower stage; and 5) a source follower output stage connected to an output of the second folded-cascode gain stage. The high swing output stage of the operational amplifier, which includes stages 3–5 above, includes a pair of natural $V_T$ devices which are P-channel transistors.

21 Claims, 7 Drawing Sheets

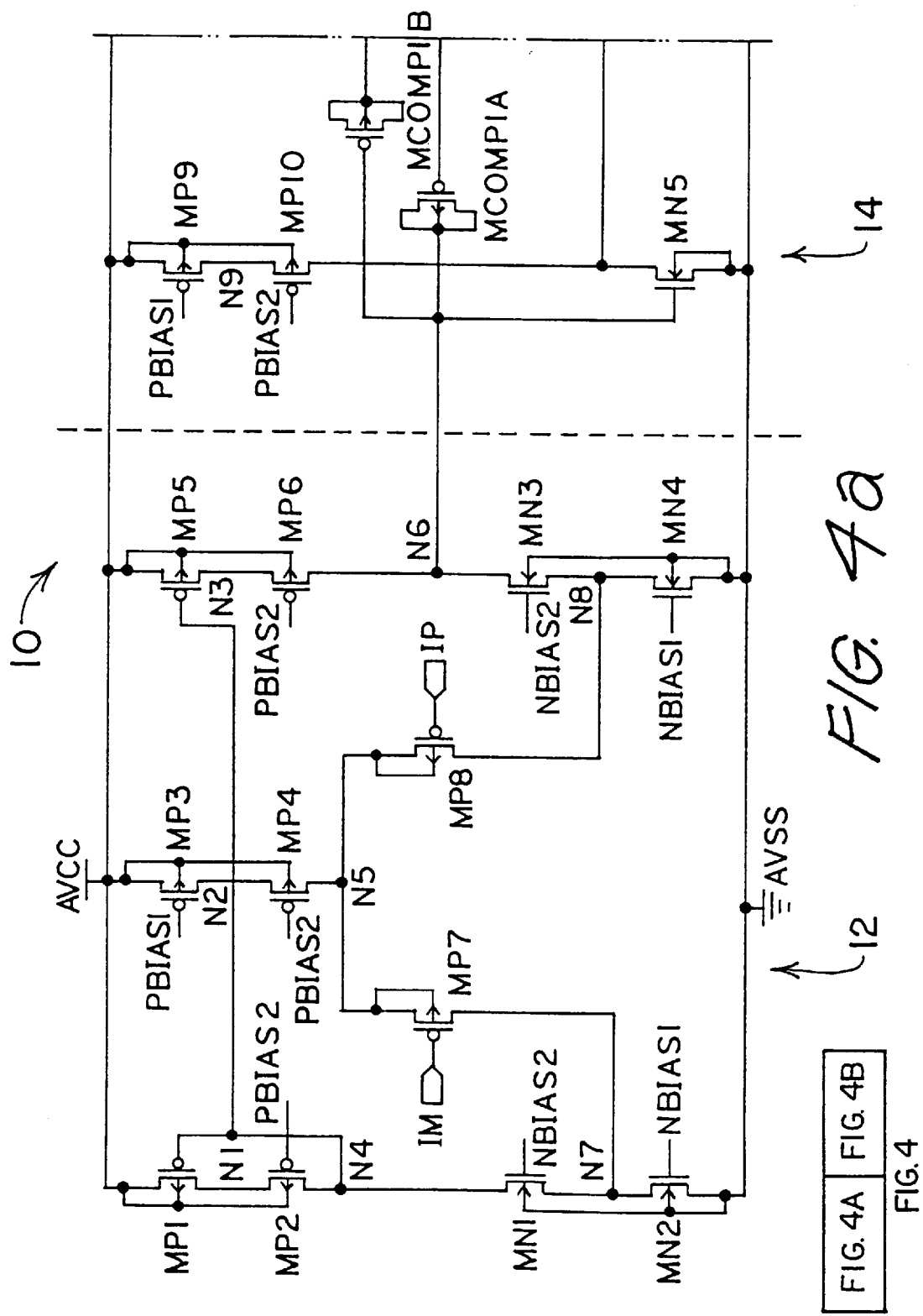

HIGH SWING LOW POWER GENERAL PURPOSE OPERATIONAL AMPLIFIER

BACKGROUND OF THE INVENTION

1. Field of the Invention.

This invention relates to a high swing, low power general purpose operational amplifier.

2. Discussion of the Related Technology

At present, wireless telephony markets are requiring that analog circuits have improved audio performance and operate with battery powered applications. This requires analog circuit architecture to have increased dynamic range, low noise and low power consumption. The basic building block that establishes audio performance is the general purpose operational amplifier (op amp). This type of op amp drives internal signals, establishes the overall voltage swing and defines the basic power consumption for the entire architecture. The basic concept for improving the dynamic range of the general purpose op amp is to create an amplifier having larger input and output voltage swings. This reduces the influence of any noise component with respect to the desired analog signal.

In general, CMOS op amps having a large input and output swing, or large common mode range, capable of driving moderate resistive and capacitive loads, have required a more complex circuit for the input pair and output driving stages. Typically, the input differential pair circuit includes a plurality of N-channel and P-channel enhancement transistors configured in such a way that the N-channels are operational during one half of the common mode voltage range and the P-channels are operational during the opposite half of the common mode voltage range (FIG. 1). By similar analogy, the high swing, low power output stage is configured in a push-pull architecture where the sourcing transistor is turned on hard and the sinking transistor is minimally turned on for one half of the voltage swing. Likewise, during the opposite half of the voltage swing, the sourcing transistor is minimally turned on and the sinking transistor is turned on hard. In general, these types of op amps are quite complex, have linearity problems and may exhibit cross-over distortion during the transition when the N-channel transistors are turning off and the P-channels are turning on, or vice versa.

Referring to FIGS. 2a and 2b, CMOS op amps having the traditional single type transistor input pairs, ones that only use only P-channel or N-channel input devices, have limited common mode range with respect to one power rail or the other. The P-channel differential pair has a common mode range from ground to about $V_{CC}$ −1.3 volts due to the required $V_T$ and $V_{DSAT}$ of the input pair and current sourcing transistors. Likewise, the N-channel differential pair has a common mode voltage range from $V_{CC}$ to about $V_{SS}$ +1.3 volts. This is due to the required $V_T$ of the input pair and similar current sinking transistors that establish the current sink. Thus, the need exists for a high swing, low power general purpose op amp having simplistic circuit implementation for driving resistive and capacitive loads.

SUMMARY OF THE INVENTION

The present invention implements a high swing, low power general purpose operational amplifier (op amp) having two types of enhancement mode transistors—a natural $V_T$ device and an implant adjust $V_T$ device. The natural devices have a lower doping concentration in the channel, hence, a much lower threshold voltage. The implant adjust $V_T$ devices have a higher doping concentration under the gate to increase the threshold voltage and guarantee that the device has a very low leakage current when the $V_{GS}$ =0 and for all temperature, process and power supply variations. The natural transistor has a $V_T$ near zero volts (i.e. approximately 0.1 v) and can become leaky and unable to turn completely off for variations in temperature, process and power supply.

The present invention strategically places the natural devices within the circuit architecture such that the leaky behavior of the device will not hinder the op amp's operation, because the natural device is not turned off. The op amp of the present invention is used exclusively in the input differential pairs of a general purpose CMOS op amp and as source-follower CMOS output stages.

By using a mixture of normal enhancement and natural devices, more simplified circuits having large voltage swings are achieved and lower power consumption. The present invention implements high swing folded-cascode gain stages, source-follower gain stages and a unique combination of implementations to achieve a robust high swing, low power general purpose op amp. The present invention achieves full swing, an advantage over the CMOS op amps of FIGS. 2a and 2b, and also has improved linearity and transient response over the architecture of FIG. 1.

DETAILED DESCRIPTION OF THE PREFERRED EMBODIMENT

Figure 1:
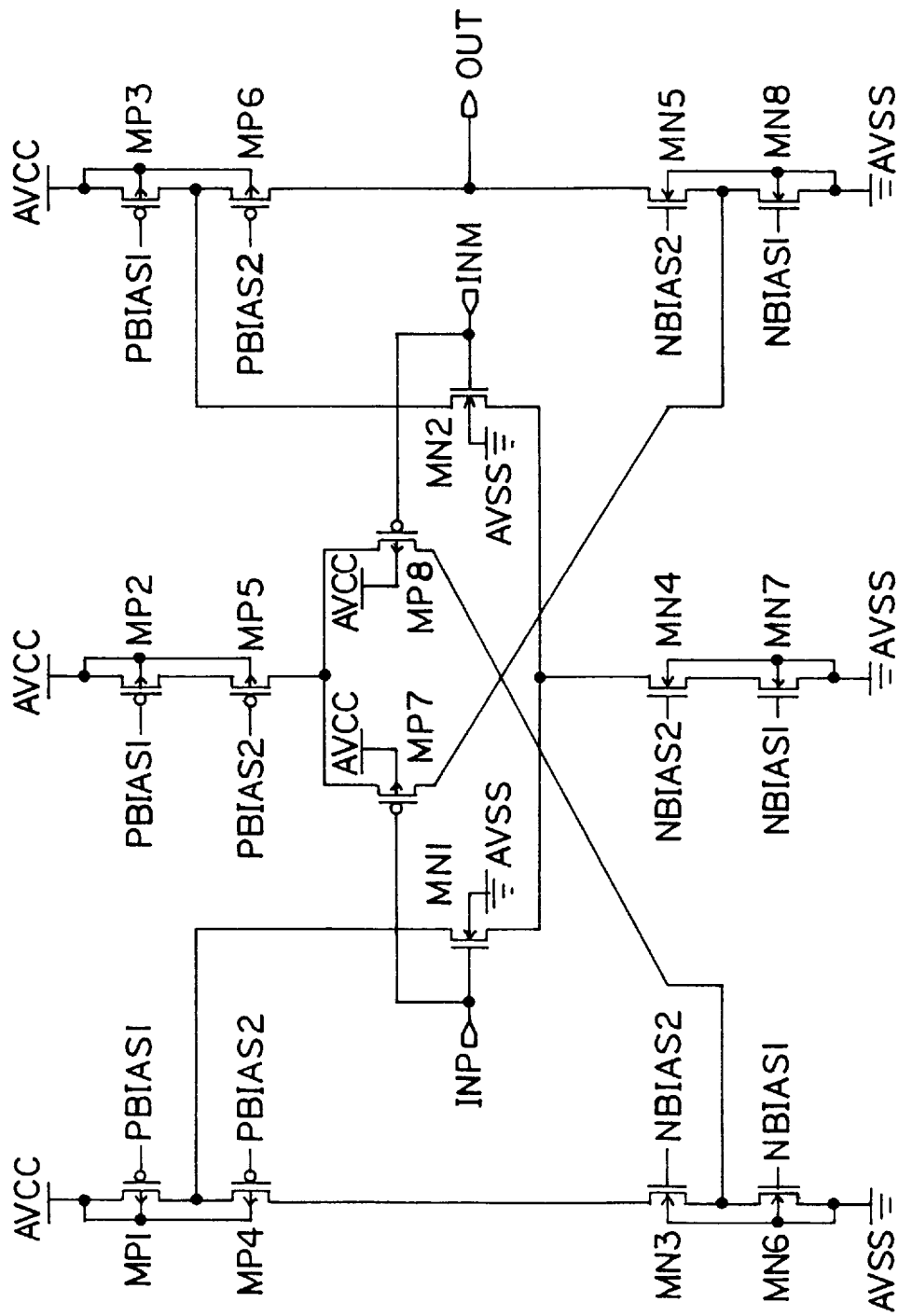
FIG. 1 is a schematic diagram of the rail to rail input differential pair using N-channel and P-channel transistors of the prior art.
Figure 2A:
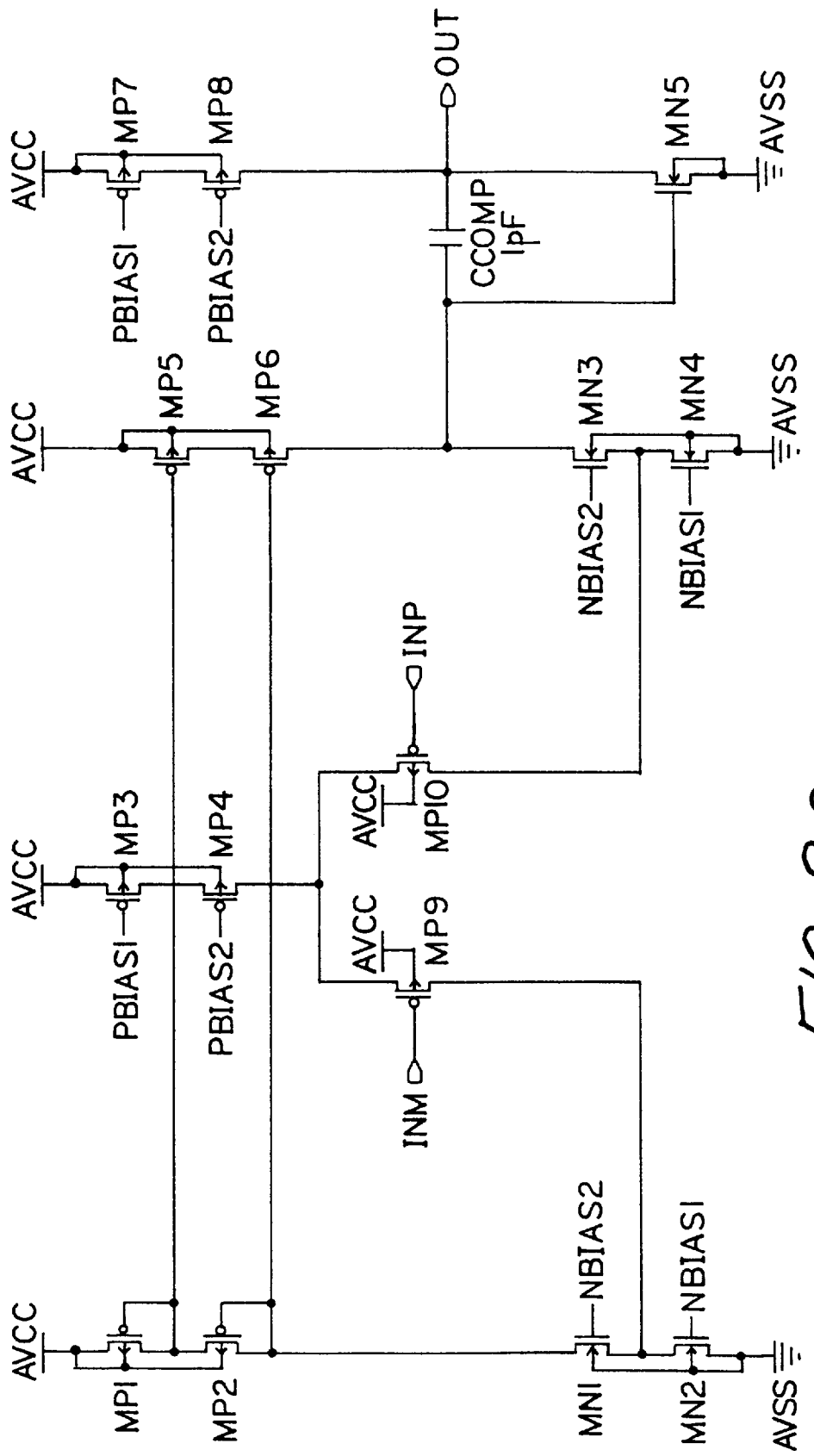
FIGS. 2a and 2b are schematic diagrams of a P-channel and N-channel input differential pair op amp architecture of the prior art.
Figure 2B:
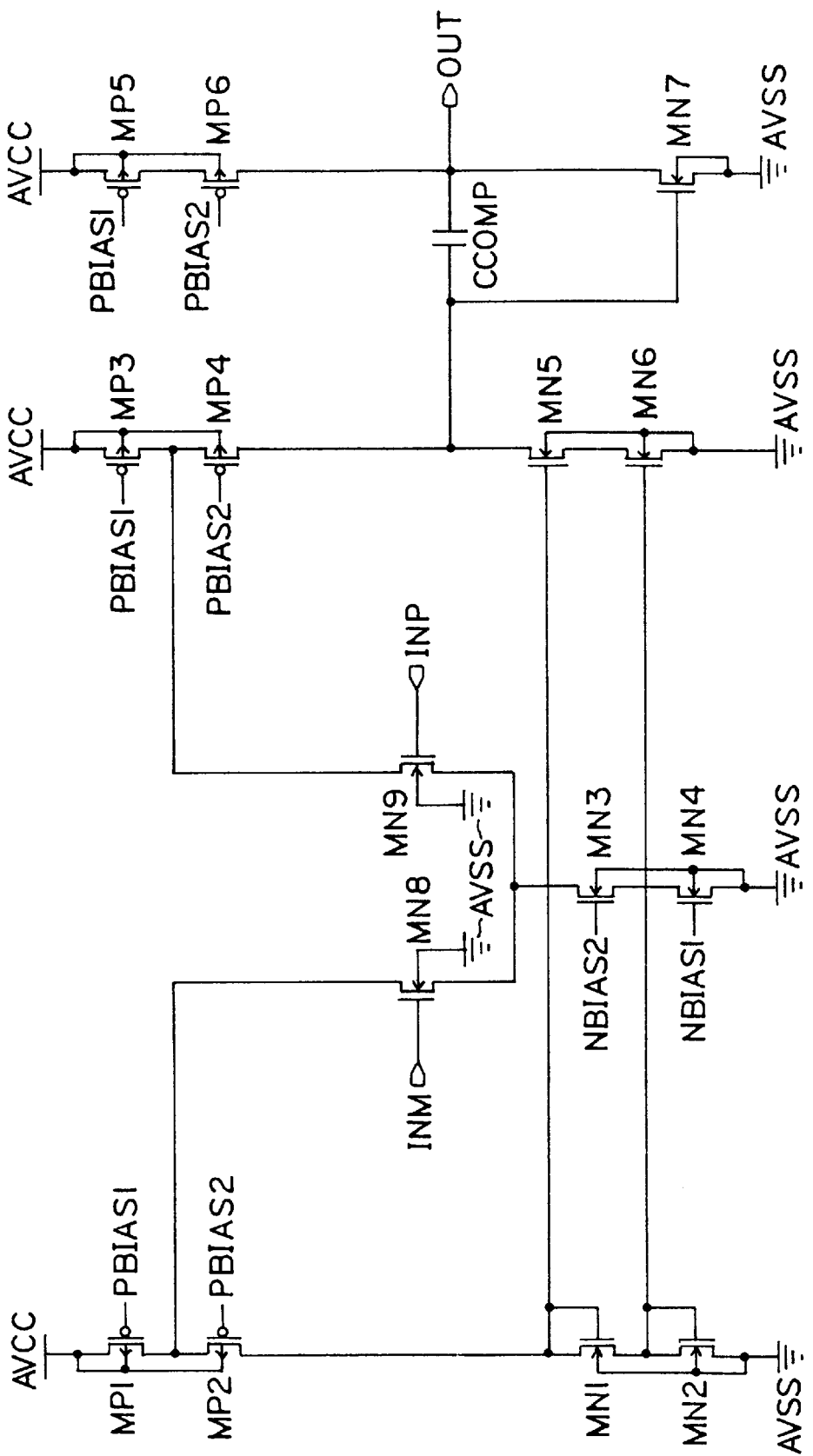

FIG. 3 depicts a pseudo push-pull CMOS op amp 10. The complete op amp 10 includes a high swing, first folded-cascode gain stage 12, a class A second gain stage 14, a slave source follower stage 16, a second folded-cascode gain stage 18, a source follower output stage 20, two Miller frequency compensation capacitors MCOMP1A and MCOMP1B for the first and second gain stages 12 and 14, and dominant pole compensation capacitor MCOMP2 for output stage 28. These capacitors are preferably MOSCAPs, the gate-to-bulk capacitance of a MOS transistor, but any implementation for a capacitor can be used. This frequency compensation is provided between the first folded-cascode gain stage 12 output node N6 and the slave source follower 16 output node N12 to produce simple Miller frequency compensation between the second gain stage 14 and the second folded-cascode gain stage 18 with the elimination of the feed forward zero produced with the compensation. The end result is increased stability for op amp 10 over highly capacitive loads.

The high swing first folded-cascode gain stage 12 utilizes P-channel natural devices MP7 and MP8 in the input pair and the high swing cascode architecture to create a large common mode range for the overall op amp architecture. By using natural devices MP7 and MP8 as the input, there is no need to switch between P- and N-channel input differential pair, as does the architecture of FIG. 1.

The second gain stage 14 is a class A architecture having rail-to-rail voltage swing. The slave source-follower stage 16 is used to eliminate a feed forward zero using Miller frequency compensation techniques and also establishes a reference voltage for the second folded-cascode gain stage 18. The second folded-cascode gain stage 18 establishes the quiescent current for the source follower output stage 20 and also creates additional current sourcing capabilities for the entire high swing output stage 28, which includes slave source follower stage 16, second folded-cascode gain stage 18 and source follower output stage 20. Lastly, the source follower output stage 20 is used to drive moderate resistive and capacitive loads. The two source follower stages 16 and 20 utilize the natural $V_T$ P-channel devices MP24 and MP23, respectively, to create a large output voltage swing.

In general, natural devices have a lower doping concentration in the channel, hence, a much lower threshold voltage. Generally, implant adjust $V_T$ devices have a higher doping concentration under the gate to increase the threshold voltage and guarantee that the device has a very low leakage current with $V_{GS}$ =0 for variations of temperature, process and power supply. The natural transistor, a current switching device, has a $V_T$ near zero volts (i.e. approximately 0.1 v) and can become leaky and unable to turn off for variations in temperature, process and power supply.

Bias currents PBIAS1 and PBIAS2 provide the bias for the respective enhancement P-channel transistors, which are current sourcing devices, or switching devices, as shown, the transistors being designated MP2, MP3, MP4, MP6, MP9, MP10, MP11, MP12, MP15 and MP16. Bias currents NBIAS1 and NBIAS2 provide the bias for the respective enhancement N-channel transistors, which are current sinking devices, or switching devices, as shown, the transistors being designated MN1, MN2, MN3, MN4, MN6, MN7, MN8 and MN9.

The high swing output stage 28 of the present invention is illustrated in FIG. 3. This output stage 28 includes slave source follower stage 16, voltage limited folded-cascode gain stage 18 and source follower output stage 20. The intended function of high swing output stage 28 is to isolate the front end op amp 10 connected to it from resistive or capacitive loading and to provide addition current sinking and sourcing capabilities when driving higher capacitance and lower resistance loads. In addition, output stage 28 isolates the output of the front end op amp from resistive and capacitive loading, thereby increasing linearity and decreasing distortion for the op amp.

An additional feature of high swing output stage 28 is the use of natural $V_T$ devices, which are preferably P-channel transistors, denoted in FIG. 3 as MP19, MP20, MP23, and MP24. These natural devices are utilized in conjunction with normal enhancement type devices, denoted in FIG. 3 as MP11, MP12, MP13, MP22, MP15, MP16, MP17, MP21, MN6, MN7, MN8 and MN9, to implement a nearly rail-to-rail voltage swing. Dominant pole frequency compensation for high swing output stage 28 is accomplished using compensation capacitor MCOMP2. This configuration establishes a single dominate pole frequency compensation independent of output loading of the front end op amp to which output stage 28 is connected, making output stage 28 stable for various resistive and capacitive loads.

In general, natural $V_T$ devices have a lower doping concentration in the channel, hence, a much lower threshold voltage. Generally, implant adjust $V_T$ devices have a higher doping concentration under the gate to increase the threshold voltage and guarantee that the device has very little leakage current with $V_{GS}$ =0 and for variations in process, supply and temperature. The natural transistor has a $V_T$ near zero volts (i.e. approximately 0.1 v) and can become leaky and unable to turn off for variations in temperature, process and power supply.

Bias signals PBIAS1 and PBIAS2 provide the bias for the respective enhancement P-channel transistors designated MP11, MP12, MP15 and MP16. Bias signals NBIAS1 and NBIAS2 provide the bias for the respective enhancement N-channel transistors designated MN6, MN7, MN8 and MN9.

The operation of high swing output stage 28 is as follows: The analog input signal to output stage 28 is received on node N11 from any suitable op amp output. Slave source follower stage 16 is a classical level shifter having a AC unity gain which level shifts the signal on node N11, by a voltage $V_T$ from a natural device, transistor MP24, and drives node N12. The source follower output stage 20 provides additional current sourcing capabilities due to the folded-cascode gain stage 18. As node N11 swings low, nodes N12 and OUT will follow N11, being level shifted by voltage $V_T$ of natural devices MP24 and MP23, respectively. As N11 swings high, nodes N12 and OUT will swing high shifted by voltage $V_T$ of natural devices MP24 and MP23, respectively.

A unique feature of slave source-follower 16 and folded cascode gain stage 18 is its ability to control the quiescent current in output stage 20 by maintaining the same $V_{GS}$ and $V_{DS}$ across transistors MP24 and MP23. Transistors MP24 and MP23 share a common gate and common source, hence their $V_{GS}$ is the same. The controlled current in output stage 20 is accomplished by gain stage 18 controlling the gate voltage on MP21 such that node OUT is at the same voltage potential as node N12, thereby maintaining exact $V_{DS}$ on transistors MP24 and MP23. Identically sized transistors, or ratiometric sized transistors, having similar $V_{GS}$ and $V_{DS}$ act as current mirroring structures.

Transistor MP23 of output stage 20 is a simple source-follower such that the node OUT follows node N11 by a voltage $V_T$ of natural device MP23. Transistor MP21 is a push-pull sourcing device, whereby as output stage 20 drives high, gain stage 18 pushes node N13 toward $V_{SS}$, allowing transistor MP21 to source more current until node OUT matches the potential on node N12. Conversely, as output stage 28 drives low, gain stage 18 pulls node N13 to $V_{CC}$, thus lowering the drive on MP21.

As shown in FIG. 3, an improvement to gain stage 18 is the addition of GM (diode connected) transistor MP22. This device prevents node N13 from collapsing to $V_{CC}$ when output stage 28 is driving low. By preventing node N13 from collapsing to $V_{CC}$, MP21 is continually conduction a small amount of current and improves the linearity and transient response observed in output stage 28.

FIG. 4 illustrates an additional embodiment for the present invention which utilizes natural devices MP7, MP8, MP19 and MP20 which have their respective bulk terminals connected to their respective source terminals. This configuration further reduces the threshold, $V_T$, for these natural devices and allows the op amp 10 to achieve even greater common mode signal swing than the embodiment illustrated in FIG. 3. Otherwise, the operation of architecture of FIG. 4 is substantially the same as that depicted in FIG. 3.

This gain circuitry of op amp 10 provides the capability of extra gain drive on transistor MP21 when driving high, and reduces the gate drive during quiescent conditions when not driving high or low. The entire high swing output stage 28 is termed a "pseudo push-pull" output such that only half the circuit provides the extra drive capabilities. This type of architecture lends itself very well for driving internal resistive and capacitive loads while having minimal power dissipation and being easily frequency compensated.

What is claimed is:

1. An operational amplifier circuit, comprising:
   (a) a folded-cascode gain stage, having an output and differential inputs;
   (b) a second gain stage having an output and having an input connected to said output of said folded-cascode gain stage;
   (c) a slave source follower stage having an output and having an input connected to said output of said second gain stage;
   (d) a voltage limited folded-cascode gain stage having an output and having an input connected to said output of said slave source follower stage; and
   (e) a source follower output stage having an output and having an input connected to said output of said voltage limited folded-cascode gain stage.

2. The circuit of claim 1, wherein said second gain stage is of a class A type configuration.

3. The circuit of claim 1, wherein said slave source follower stage is of a class A type configuration.

4. The circuit of claim 1, wherein said source follower output stage is a pseudo push-pull configuration.

5. The circuit of claim 1, further comprising at least one frequency compensation capacitor connected between said output of said first folded-cascode gain stage and said output of said slave source follower stage.

6. A high swing, low power operational amplifier, comprising:
   (a) a first folded-cascode gain stage having an output and having a differential input connected to a first differential pair of natural $V_T$ devices;
   (b) a second gain stage having an output and having an input connected to said output of said first folded-cascode gain stage; and
   (c) a high swing output stage having an output connected to an output of said op amp, and having an input connected to said output of said second gain stage.

7. The operational amplifier of claim 6, wherein said high swing output stage includes a second differential pair of natural $V_T$ devices.

8. The operational amplifier of claim 6, wherein at least one additional natural $V_T$ device is connected to said input of said high swing output stage.

9. The operation amplifier of claim 8, wherein said at least one additional natural $V_T$ device is also connected to a compensation capacitor included in said high swing output stage.

10. The operational amplifier of claim 9, wherein said high swing output stage includes a source follower output stage and a compensation capacitor connected to said op amp output.

11. The operational amplifier of claim 6, wherein said first differential pair of natural $V_T$ devices are P-channel transistors.

12. The operational amplifier of claim 7, wherein said second differential pair of natural $V_T$ devices are P-channel transistors.

13. The operational amplifier of claim 6, wherein said high swing output stage includes a slave source follower input stage having an output and an input connected to said output of said second gain stage, and wherein said operational amplifier further includes at least one Miller frequency compensation capacitor connected between said output of said first folded-cascode gain stage and said output of said slave source follower input stage.

14. The operational amplifier of claim 6, wherein said high swing output stage includes a slave source follower input stage and a source follower output stage, each said source follower stage having at least one natural $V_T$ device, wherein said at least one natural $V_T$ device of said slave source follower input stage is connected to said input of said high swing output stage and said at least one natural $V_T$ device of said source follower output stage is connected to said output of said high swing output stage.

15. The operational amplifier of claim 14, wherein each said natural $V_T$ device comprises a P-channel transistor.

16. A high swing, low power operational amplifier, comprising:
   (a) a first folded-cascode gain stage having an output and having a first differential pair of natural $V_T$ devices;
   (b) a second gain stage having and output and having an input connected to said output of said first folded-cascode gain stage; and
   (c) a high swing output stage having an output and having an input connected to said output of said second gain stage, wherein said high swing output stage includes a compensation capacitor connected to a second pair of natural $V_T$ devices, wherein one of said natural $V_T$ devices of said second pair is connected to said input of said high swing output stage and the other of said natural $V_T$ devices is connected to said output of said high swing output stage.

17. A method of maintaining a controlled quiescent current at the output of an operational amplifier, comprising the steps of:
   (a) providing an operational amplifier comprising a folded-cascode gain stage, a second gain stage, and an output stage having an output, wherein said output stage comprises: a slave source follower stage having an output, a voltage limited folded-cascode gain stage having an output, and source follower output stage;
   (b) providing a push-pull sourcing device in said output stage;
   (c) providing a plurality of natural $V_T$ devices in said output stage;
   (d) maintaining about the same $V_{DS}$ across said natural $V_T$ devices; and
   (e) maintaining a voltage on said output of said source follower output stage which is about equal to a voltage on said output of said slave source follower stage by providing a gate voltage to said push-pull sourcing device from said output of said voltage limited folded-cascode gain stage.

18. A method of maintaining a controlled quiescent current at the output of an operational amplifier, comprising the steps of:
   (a) providing an operational amplifier, which includes a high swing output stage; wherein said output stage includes:
      1) a source follower input stage having an output and having an input;
      2) a folded-cascode gain stage having an output and having an input connected to said output of said source follower input stage; and 3) a source follower output stage having an output and having an input connected to said output of said folded-cascode gain stage, wherein said source follower output is connected to an output of said operational amplifier;

(b) providing a first natural $V_T$ device which is connected to said output of said operational amplifier;

(c) providing a second natural $V_T$ device which is connected to said input of said source follower input stage;

(d) providing a first switching device having an output, and being connected to said folded-cascode gain stage;

(e) providing a second switching device having an input and having an output connected to said operational amplifier output; and (f) providing a connection between said output of said first switching device and said input of said second switching device, wherein said first switching device prevents said input of said second switching device from reaching ground potential ($V_{CC}$) when said high swing output stage is driving low.

19. The method of claim 18, wherein the bulk and gate of said first switching device are connected together.

20. The method of claim 18, wherein said first switching device is a diode connected transistor.

21. The output stage of claim 16, wherein said first or said second differential pair of natural $V_T$ devices have their respective source terminal connected to their respective gate terminal.

* * * * *

UNITED STATES PATENT AND TRADEMARK OFFICE
CERTIFICATE OF CORRECTION

PATENT NO. : 5,805,021
ISSUE DATE : September 8, 1998
INVENTOR(S) : Brehmer, Geoffrey E.

Figure 3A:
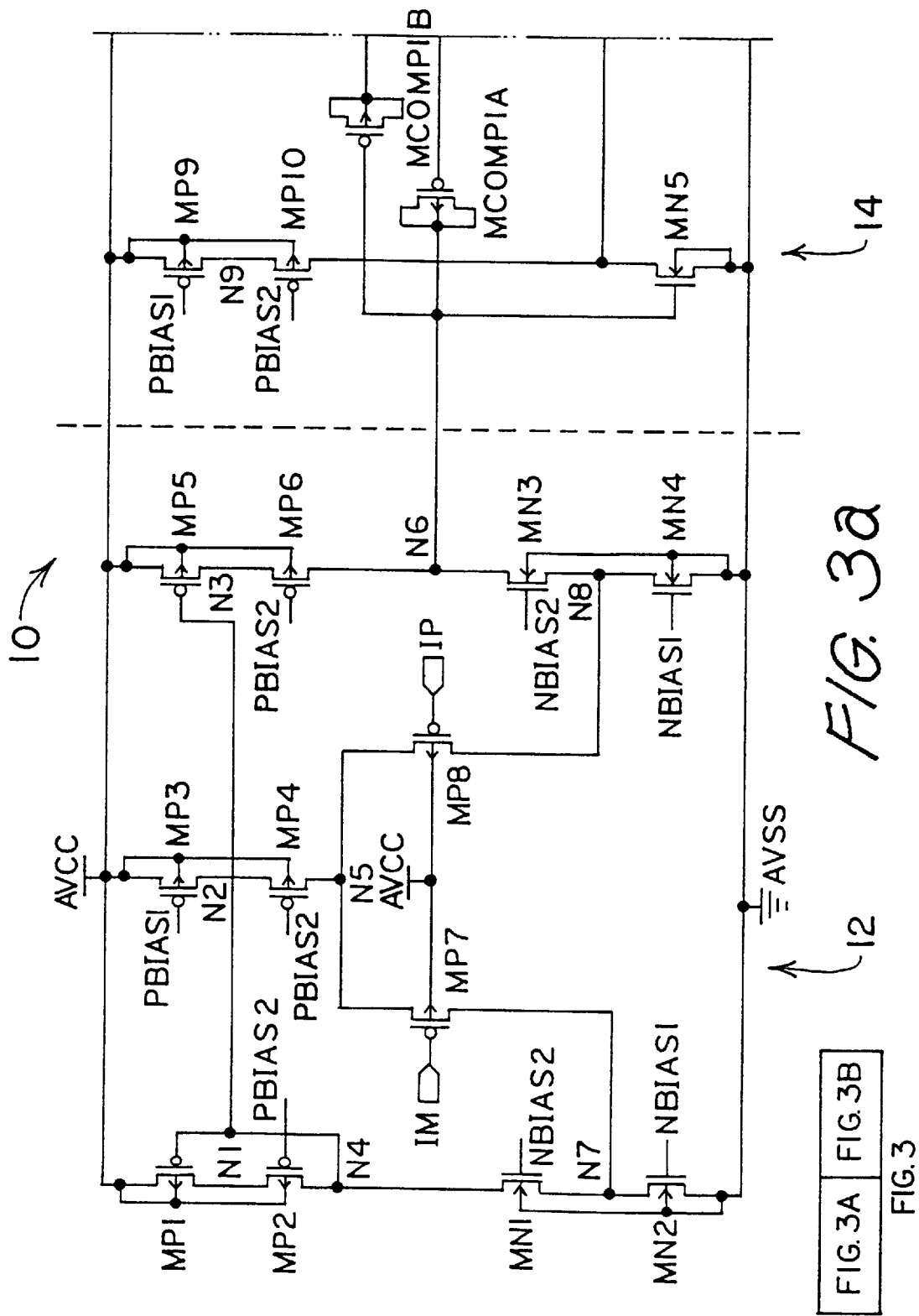
FIG. 3 is a schematic diagram of an embodiment of the high swing, low power op amp of the present invention.
Figure 3B:
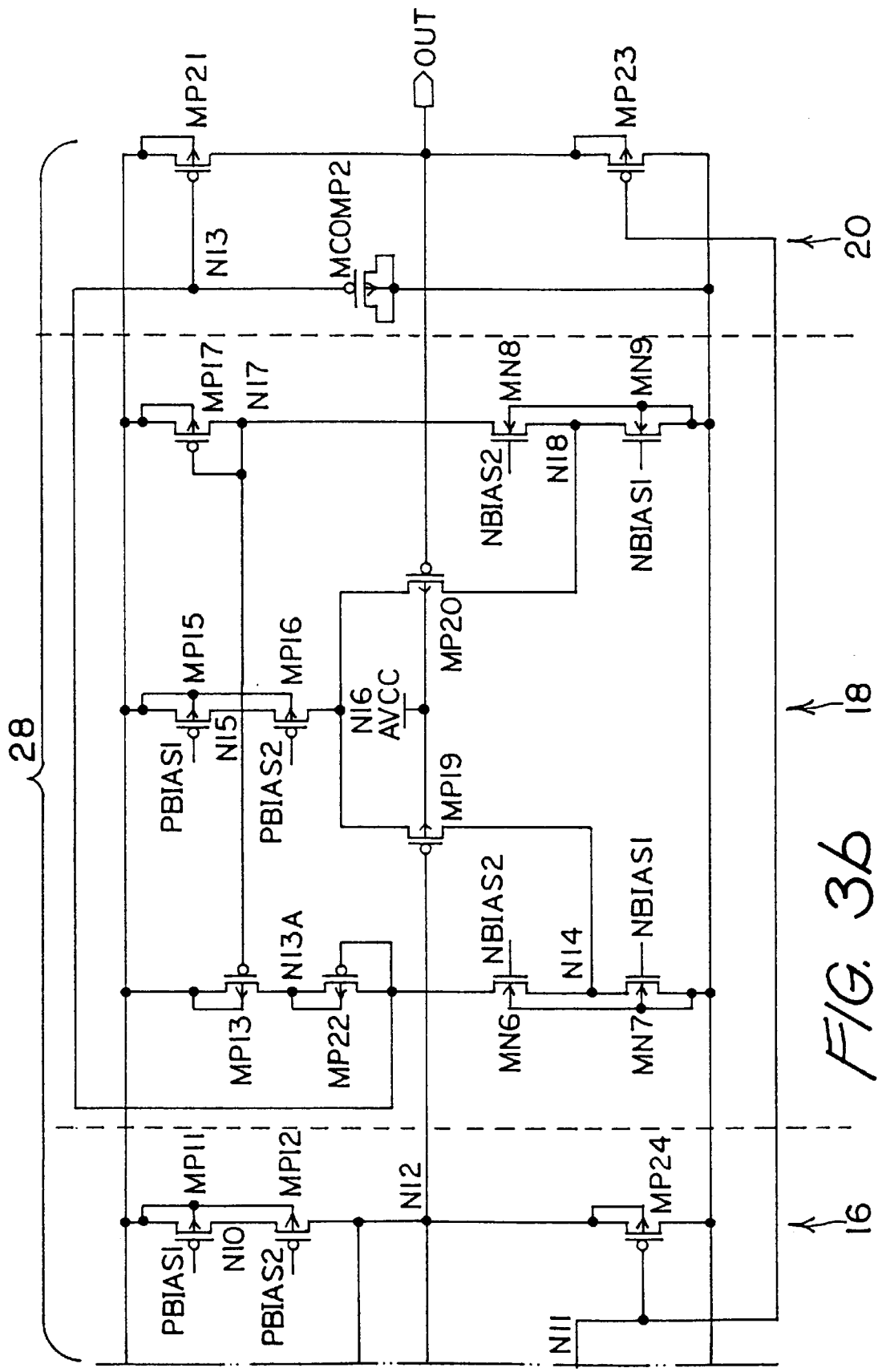
Figure 4B:
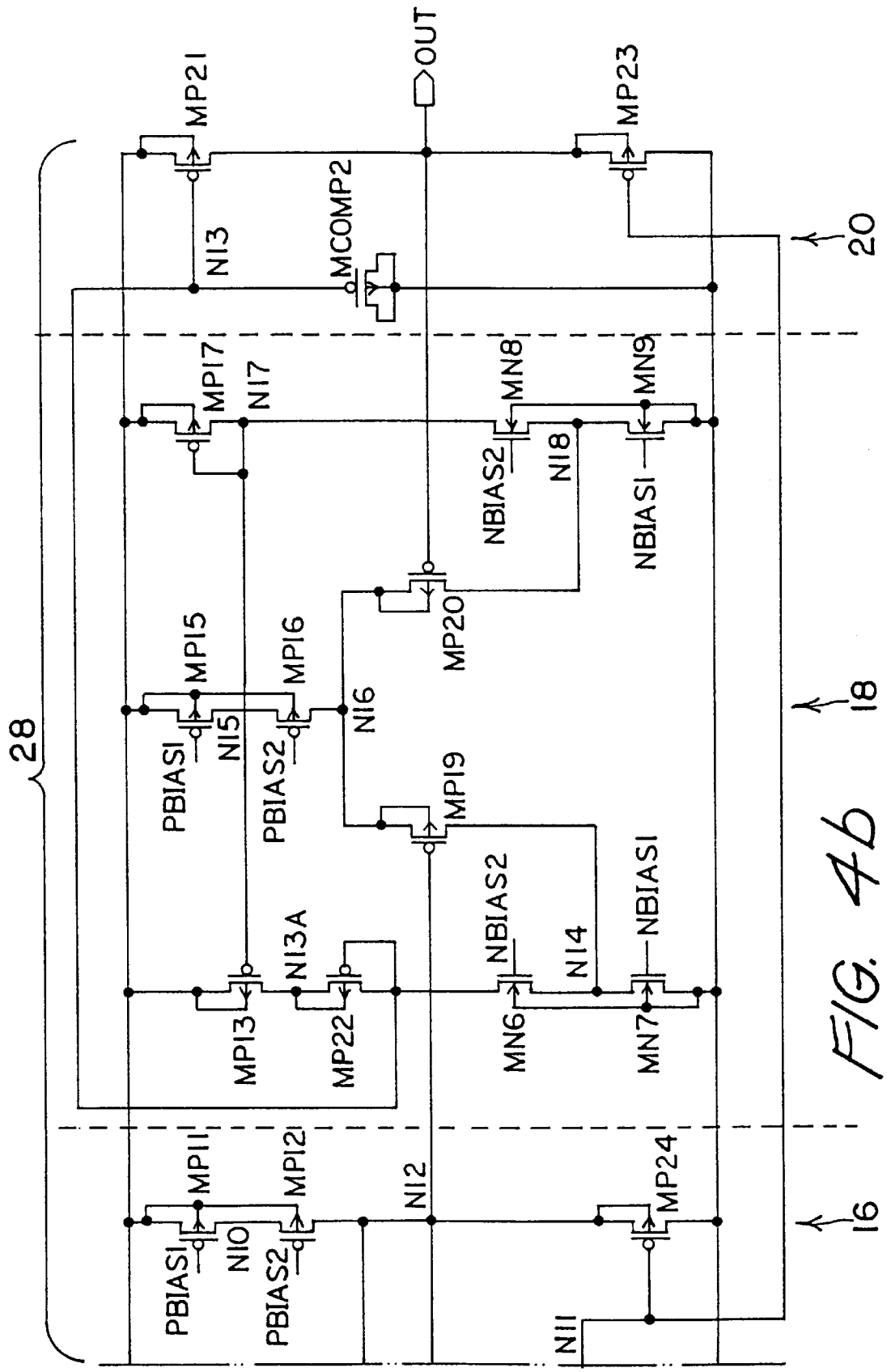
FIG. 4 is a schematic diagram of an additional embodiment of the high swing, low power op amp of the present invention.

It is certified that error appears in the above-identified patent and that said Letters Patent is hereby corrected as shown below:

Column 2, line 35; please delete "FIG. 3 is" and insert --FIGS. 3a and 3b are--,
Column 2, line 37; please delete "FIG. 4 is" and insert --FIGS. 4a and 4b are --,
Column 3, line 44; please delete "FIG. 3 depicts" and insert --FIGS. 3a and 3b depict--,
Column 3, line 40; please delete "FIG. 3" and insert --FIGS. 3a and 3b--,
Column 3, line 53; please delete "FIG. 3" and insert --FIGS. 3a and 3b--,
Column 3, line 55; please delete "FIG. 3" and insert --FIGS. 3a and 3b--,
Column 4, line 50; please delete "FIG. 3" and insert --FIGS. 3a and 3b--,
Column 4, line 54; please delete "conduction" and insert --conducting--,
Column 4, line 57; please delete "FIG. 4 illustrates" and insert "FIGS. 4a and 4b illustrate--, *and*
Column 4, line 64; please delete "FIG. 3" and insert --FIGS. 3a and 3b-- and please delete "FIG. 4" and insert --FIGS. 4a and 4b--.

Column 4, line 65, delete "Fig. 3" and insert--Figs. 3a and 3b--.

Signed and Sealed this

Seventh Day of September, 1999

Q. TODD DICKINSON

*Attest:*

*Attesting Officer*     *Acting Commissioner of Patents and Trademarks*